United States Patent
Ha et al.

(10) Patent No.: US 12,414,230 B2
(45) Date of Patent: Sep. 9, 2025

(54) PRINTED CIRCUIT BOARD, FABRICATION METHOD OF THE SAME AND ELECTRONIC DEVICE INCLUDING THE SAME

(71) Applicant: Samsung Electronics Co., Ltd., Suwon-si (KR)

(72) Inventors: Sangwon Ha, Suwon-si (KR); Hyunmo Yang, Suwon-si (KR); Yeonkyung Chung, Suwon-si (KR); Younoh Chi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 200 days.

(21) Appl. No.: 17/968,308

(22) Filed: Oct. 18, 2022

(65) Prior Publication Data
US 2023/0121285 A1 Apr. 20, 2023

Related U.S. Application Data

(63) Continuation of application No. PCT/KR2022/015494, filed on Oct. 13, 2022.

(30) Foreign Application Priority Data

Oct. 15, 2021 (KR) .......... 10-2021-0137426

(51) Int. Cl.
*H05K 1/02* (2006.01)
*H05K 1/11* (2006.01)
(Continued)

(52) U.S. Cl.
CPC ............ *H05K 1/028* (2013.01); *H05K 1/113* (2013.01); *H05K 3/061* (2013.01); *H05K 3/243* (2013.01);
(Continued)

(58) Field of Classification Search
CPC ........ H05K 1/028; H05K 1/113; H05K 3/061; H05K 3/243; H05K 3/421;
(Continued)

(56) References Cited

U.S. PATENT DOCUMENTS 5,206,463 A * 4/1993 DeMaso .............. H05K 3/4691
174/262
5,615,088 A 3/1997 Mizumo
(Continued)

FOREIGN PATENT DOCUMENTS

JP 2012-134490 A 7/2012
KR 10-2006-0052696 A 5/2006
(Continued)

OTHER PUBLICATIONS

International Search Report dated Jan. 13, 2023, issued in an International Application No. PCT/KR2022/015494.

*Primary Examiner* — Timothy J Thompson
*Assistant Examiner* — Paramita Ghosh
(74) *Attorney, Agent, or Firm* — Jefferson IP Law, LLP

(57) ABSTRACT

A printed circuit board and/or an electronic device including the same are provided. The printed circuit board and/or an electronic device includes at least one insulation layer including a first rigid region and a flexible region extending from the first rigid region, at least one first circuit pattern disposed on one surface of the at least one insulation layer to at least partially transverse the flexible region from the first rigid region, and at least one conductive pad formed at least partially on a surface of the first circuit pattern in the first rigid region, wherein the flexible region may be configured to flexibly deform more than the first rigid region.

11 Claims, 8 Drawing Sheets

(51) Int. Cl.
*H05K 3/06* (2006.01)
*H05K 3/24* (2006.01)
*H05K 3/42* (2006.01)

(52) U.S. Cl.
CPC ... *H05K 3/421* (2013.01); *H05K 2201/09481* (2013.01); *H05K 2201/09545* (2013.01); *H05K 2203/143* (2013.01); *H05K 2203/1461* (2013.01)

(58) Field of Classification Search
CPC .......... H05K 2201/09481; H05K 2201/09545; H05K 2203/143; H05K 2203/1461; H05K 1/0393; H05K 1/118; H05K 1/147; H05K 3/4691; H05K 2201/05; H05K 2201/09754; H05K 2201/0999; H01K 1/023; H04M 1/0216
See application file for complete search history.

(56) References Cited

U.S. PATENT DOCUMENTS

| | | | |
|---|---|---|---|
| 6,198,052 B1 * | 3/2001 | Omote | H05K 3/328 |
| | | | 174/255 |
| 6,268,783 B1 | 7/2001 | Kamiya | |
| 8,536,457 B2 | 9/2013 | Takahashi | |
| 9,198,304 B2 | 11/2015 | Li | |
| 2007/0012475 A1 | 1/2007 | Kawaguchi et al. | |
| 2007/0117261 A1 * | 5/2007 | Ueno | H05K 3/4691 |
| | | | 438/106 |
| 2008/0289859 A1 | 11/2008 | Mikado et al. | |
| 2010/0157548 A1 * | 6/2010 | Wang | H05K 1/028 |
| | | | 361/749 |
| 2014/0168926 A1 | 6/2014 | Colman | |
| 2014/0300009 A1 * | 10/2014 | Hsu | H05K 3/4691 |
| | | | 257/784 |
| 2017/0318674 A1 * | 11/2017 | Kaibuki | H05K 1/115 |
| 2018/0132358 A1 | 5/2018 | Lin et al. | |
| 2020/0092981 A1 | 3/2020 | Dan | |
| 2021/0185806 A1 | 6/2021 | Kim et al. | |
| 2021/0212201 A1 | 7/2021 | Hwang et al. | |

FOREIGN PATENT DOCUMENTS

| | | |
|---|---|---|
| KR | 10-2014-0034751 A | 3/2014 |
| KR | 10-2017-0083833 A | 7/2017 |
| KR | 10-2018-0112977 A | 10/2018 |
| KR | 10-1905879 B1 | 11/2018 |
| KR | 10-2019-0061453 A | 6/2019 |
| KR | 10-2021-0088225 A | 7/2021 |

* cited by examiner

PRINTED CIRCUIT BOARD, FABRICATION METHOD OF THE SAME AND ELECTRONIC DEVICE INCLUDING THE SAME

CROSS-REFERENCE TO RELATED APPLICATION(S)

This application is a continuation application, claiming priority under § 365(c), of an International application No. PCT/KR2022/015494, filed on Oct. 13, 2022, which is based on and claims the benefit of a Korean patent application number 10-2021-0137426, filed on Oct. 15, 2021, in the Korean Intellectual Property Office, the disclosures of which are incorporated by reference herein in its entireties.

TECHNICAL FIELD

The disclosure relates to an electronic device. More particularly, the disclosure relates to a printed circuit board and an electronic device including the same.

BACKGROUND ART

In line with development of electronic, information, and communication technologies, various functions tend to be integrated in a single electronic device. for example, an electronic device (for example, a smartphone) includes not only a communication function, but also functions, such as a sound playback device, an imaging device, or an electronic wallet, and more diversified functions may be implemented in the smartphone by installing additional applications. The electronic device may not only execute installed applications or stored functions, but also access a server or another electronic device in a wired or wireless manner and receive various kinds of information in real time.

As various functions are implemented in a single electronic device, more wires are used for connection with electric/electronic components, such as a display, an acoustic component, a camera, and various sensors. As a result of improved image or sound quality, electronic devices may include more electric/electronic components and more signal wires connected thereto. Flexible displays have recently been commercialized, and foldable electronic devices having a combination of multiple structures (for example, housings) configured to move relative to each other have been commercialized accordingly. The multiple structures may be folded when carried and may be unfolded when used such that wide screens can be utilized, thereby improving use convenience. On the other hand, wearable electronic devices of wrist watch types or eyeglass types may be more convenient to carry and to use, although they have limited functions compared with smartphones or tablet personal computers (PCs).

A printed circuit board may provide a means for disposing or electrically connecting different electric/electronic components inside such an electronic device, and a flexible printed circuit board may be used, depending on the wiring environment, thereby improving the degree of freedom in connection with designing various signal wires. For example, integrated circuit chip(s) or various active/passive element(s) may be commonly disposed on a rigid circuit board, and a component, such as a display or a camera may be electrically connected to a circuit board having integrated circuit chips(s) disposed thereon through a signal wire, such as a flexible printed circuit board.

The above information is presented as background information only to assist with an understanding of the disclosure. No determination has been made, and no assertion is made, as to whether any of the above might be applicable as prior art with regard to the disclosure.

DETAILED DESCRIPTION OF THE INVENTION

Technical Problem

In the case of an electronic device having a combination of different multiple structures (for example, housings), a flexible printed circuit board may be used to electrically connect electric/electronic components disposed on different structures. However, a connector may need to be disposed to connect a flexible printed circuit board and a rigid circuit board, and disposing such a connector may be an obstacle to making circuit boards or electronic devices compact. As electric/electronic components tend to have a higher level of performance, more signal wires may be disposed on a flexible printed circuit board, and the flexibility of the flexible printed circuit board may be degraded by the increasing signal wires. For example, if the flexibility of the flexible printed circuit board is degraded, housings of an electronic device configured to be folded to face each other or to rotate between positions in which they are unfolded side by side may fail to smoothly fold/unfold, and the durability of the flexible printed circuit board may be degraded by repeated folding/unfolding operations.

Aspects of the disclosure are to address at least the above-mentioned problems and/or disadvantages and to provide at least the advantages described below. Accordingly, an aspect of the disclosure is to provide a printed circuit board including a rigid region and a flexible region configured to deform more flexibly than the rigid region, thereby facilitating compactness, a method for manufacturing the same, and/or an electronic device including the same.

Another aspect of the disclosure is to provide a printed circuit board having improved reliability and durability while providing electric connection between different structures configured to move relative to each other, a method for manufacturing the same, and/or an electronic device including the same.

Additional aspects will be set forth in part in the description which follows and, in part, will be apparent from the description, or may be learned by practice of the presented embodiments.

Technical Solution

In accordance with an aspect of the disclosure, a printed circuit board and/or an electronic device including the same are provided. The printed circuit board and/or an electronic device include at least one insulation layer including a first rigid region and a flexible region extending from the first rigid region, at least one first circuit pattern disposed on a first surface of the at least one insulation layer to at least partially transverse the flexible region from the first rigid region, and at least one conductive pad at least partially formed on a surface of the at least one first circuit pattern in the first rigid region, wherein the flexible region is configured to flexibly deform more than the first rigid region.

In accordance with another aspect of the disclosure, an electronic device is provided. The electronic device includes a first housing, a second housing coupled to the first housing and coupled to be rotatable with respect to the first housing, a hinge structure configured to rotatably couple the second housing to the first housing, and a printed circuit board, wherein the printed circuit board includes at least one insulation layer including a first rigid region and a flexible region extending from the first rigid region, at least one first circuit pattern disposed on a first surface of the at least one insulation layer to at least partially transverse the flexible region from the first rigid region, and at least one conductive pad at least partially formed on a surface of the at least one first circuit pattern in the first rigid region, and wherein the flexible region is disposed to at least partially extend through a region in which the hinge structure is disposed and is configured to flexibly deform more than the first rigid region.

In accordance with another aspect of the disclosure, a method for fabricating a printed circuit board is provided. The method includes preparing at least one insulation layer including a first rigid region and a flexible region extending from the first rigid region, laminating an electrically conductive film on at least one surface of the at least one insulation layer, attaching a dry film to a surface of the electrically conductive film and removing a portion of the dry film therefrom to expose a portion of the electrically conductive film, forming a plating layer on at least a portion of an exposed surface of the electrically conductive film, exposing at least a portion of the electrically conductive film or at least a portion of the plating layer by removing the dry film and by forming an etching mask, and etching and removing at least the exposed portion of the electrically conductive film or at least the exposed portion of the plating layer.

Advantageous Effects

According to various embodiments of the disclosure, a printed circuit board may include a rigid region and a flexible region, thereby improving the degree of freedom in connection with disposing signal wires, and the flexible region may extend from the rigid region without a separate connector such that the printed circuit compact becomes compact and/or a signal wire space can be easily secured. According to various embodiments of the disclosure, signal wires and/or circuit patterns may include rolled copper foils in the flexible region such that, while allowing the same to deform more flexibly than the rigid region, durability of the signal wires and/or circuit patterns can be secured despite repeated deformation of the flexible region. Various other advantageous effects identified explicitly or implicitly through the disclosure may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR INVENTION

Figure 1:
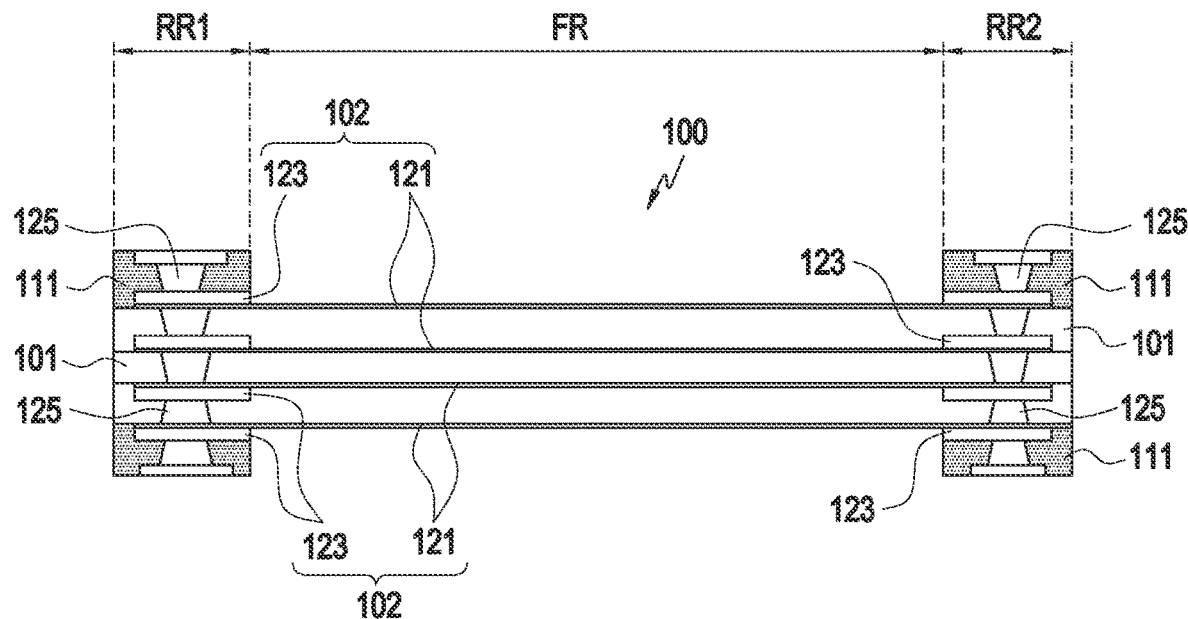
FIG. 1 is a cross-sectional configuration diagram illustrating a printed circuit board according to an embodiment of the disclosure.

The following description with reference to the accompanying drawings is provided to assist in a comprehensive understanding of various embodiments of the disclosure as defined by the claims and their equivalents. It includes various specific details in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and configurations may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular form of "a", "an", and "the" include plural referents unless the context clearly dictates otherwise. Thus, for example, reference to "a component surface" includes reference to one or more of such surfaces.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program) including one or more instructions that are stored in a storage medium (e.g., an internal memory or external memory) that is readable by a machine (e.g., the electronic device). For example, a processor (e.g., the processor) of the machine (e.g., the electronic device) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

FIG. 1 is a cross-sectional configuration diagram illustrating a printed circuit board according to an embodiment of the disclosure.

Figure 2:
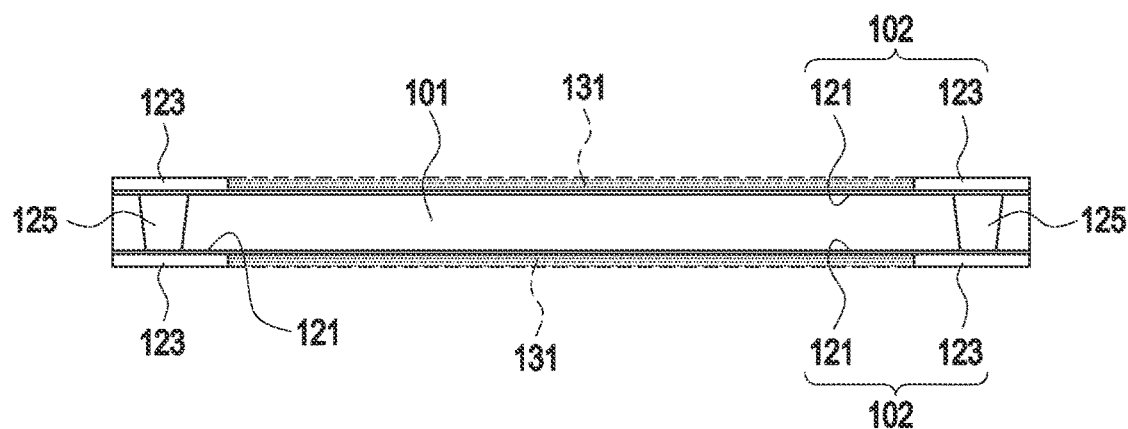
FIG. 2 illustrates a simplified printed circuit board according to an embodiment of the disclosure.

FIG. 2 illustrates a simplified printed circuit board according to an embodiment of the disclosure.

Referring to FIGS. 1 and 2, a printed circuit board 100 may include at least one insulation layers 101 or 111 and at least one wiring layer 102, and the insulation layer 101 or 111 may include at least one rigid region (RR1 or RR2) and a flexible region (FR) extending from the rigid region (RR1 or RR2). In one embodiment of the disclosure, the flexible region (FR) may flexibly deform more than the rigid region (RR1 or RR2). For example, when an external force is applied, the rigid region (RR1 or RR2) may be substantially maintained in a flat plate shape, and the flexible region (FR) may be variously deformed into a flat plate shape and a curved shape. In another embodiment of the disclosure, when the printed circuit board 100 includes a plurality of rigid regions (RR1 and RR2), the flexible region (FR) may be a flexible structure that mechanically connects the rigid regions (RR1 and RR2).

According to various embodiments of the disclosure, the insulation layer 101 or 111 may include a synthetic resin film, such as polyimide or polyethylene terephthalate (PET) and provide a surface or a region forming a circuit pattern 121 and/or the at least one wiring layer 102. In an embodiment of the disclosure, the printed circuit board 100 may include a plurality of insulation layers 101 and 111, and the at least one wiring layer 102 (e.g., the circuit pattern 121) disposed on different surfaces of the insulation layer 101 or 111 or on the different insulation layers 101 and 111 may be electrically connected through a via hole (e.g., the via hole 23 of FIG. 9) or a via conductor 125 formed through the insulation layer 101 or 111. The via conductor 125 may include a metal material or a plating layer at least partially disposed on the via hole 23.

According to various embodiments of the disclosure, the printed circuit board 100 may include two or more, for example, approximately six insulation layers 101 and 111, and the flexible region (FR) may be deformed into a flat or curved shape by an external force. According to an embodiment of the disclosure, in the case of including five insulation layers 101 and 111, the printed circuit board 100 may include four to six wiring layer(s) 102 disposed between two adjacent insulation layers 101 and 111 and/or on the surface of the outermost insulation layer. The number of the insulation layers 101 and 111 and the wiring layers 102 included in the printed circuit board 100 are not limited to the example, and may be determined by various combinations according to required specifications. For example, the number of wiring layers 102 may be appropriately selected within the range of one to eight according to the specifications required for the printed circuit board 100, and the number of insulation layers 101 may be determined to correspond to the selected number of wiring layers 102. In an embodiment of the disclosure, when the printed circuit board 100 includes a plurality of insulation layers 101 and 111, one (e.g., the insulation layer indicated by '111') of the plurality of insulation layers 101 and 111 may contain a genetic material, such as FR4. For example, the printed circuit board 100 may further include an additional insulation layer 111 which is present in the rigid regions (RR1 and RR2) but not in the flexible region (FR). In an embodiment of the disclosure, the insulation layer 111 may be formed of a glass epoxy material (e.g., an FR4 material and/or a CEM-1 material).

According to various embodiments of the disclosure, the wiring layer 102 may include at least one circuit pattern 121 and at least one conductive pad 123. The circuit pattern 121 may be disposed on at least one surface of the insulation layer 101 to at least partially transverse the flexible region (FR) from the rigid region RR1 or RR2. When a plurality of rigid regions (RR1 and RR2) are provided, both ends of the circuit pattern 121 may be disposed in at least one of the rigid regions (RR1 and RR2) and may be disposed to transverse the flexible region (FR). For example, the circuit pattern 121 may transverse the flexible region (FR) to electrically connect the electric/electronic components disposed in the rigid regions (RR1 and RR2).

According to various embodiments of the disclosure, the circuit patterns 121 may be respectively disposed on both surfaces of one insulation layer 101, and according to an embodiment of the disclosure, the via conductor 125 formed through the insulation layer 101 or 111 may be electrically connected to the circuit patterns 121 on both surfaces of the insulation layer 101. In an embodiment of the disclosure, when the printed circuit board 100 includes a plurality of insulation layers 101, the insulation layers 101 may be sequentially stacked to each other, and the plurality of circuit patterns 121 may be disposed on at least a portion between two adjacent insulation layers 101 among the insulation layers 101 or on at least a portion of the surface of the outermost insulation layer 101 of the insulation layers 101, respectively. In the illustrated embodiment of the disclosure, the outermost circuit pattern 121 is illustrated as being exposed to the external space, but various embodiments of the disclosure are not limited thereto, and the outmost circuit pattern 121 may be protected by another insulation layer or coating layer disposed thereon which is not shown.

According to various embodiments of the disclosure, the printed circuit board 100 may include via holes (e.g., the via holes 23 of FIG. 4) or via conductors 125 formed through the plurality of insulation layers 101 and 111, and the circuit patterns 121 disposed on different layers may be electrically connected through the via conductor 125. In the following detailed description, when it is necessary to distinguish the rigid regions (RR1 and RR2) or the circuit patterns 121 disposed on different layers, ordinal numbers, such as 'first' and 'second' may be assigned thereto, but it should be noted that the ordinal numbers are merely for classification, and the assignment of such an ordinal number does not limit various embodiments of the disclosure.

According to various embodiments of the disclosure, the circuit pattern 121 may include at least a portion of an electrically conductive film laminated on the surface of the insulation layer 101, for example, a rolled copper foil. In general, the circuit pattern of the printed circuit board may be disposed based on a plating layer or an electrolytic copper foil formed by a plating method, but in various embodiments of the disclosure, the circuit pattern 121 in the flexible region (FR) may include at least a portion of a rolled copper foil. Compared with an electrolytic copper foil, an electrically conductive film, such as a rolled copper foil may have considerable durability due to the high elongation thereof even with repeated deformation while being disposed in the flexible region (FR).

According to various embodiments of the disclosure, the conductive pad 123 may be disposed in a first rigid region (RR1) (or a second rigid region (RR2)) and may be at least partially disposed on the surface of the circuit pattern 121. The conductive pad 123 in the rigid region (RR1 or RR2) may be disposed at a position corresponding to the via hole 23 or the via conductor 125. For example, in electrically connecting the circuit patterns 121 disposed on different layers, the conductive pad 123 between the via conductor 125 and the circuit pattern(s) 121 may provide a stable contact structure or stable electrical connection structure. According to one embodiment of the disclosure, the conductive pad 123 and the via conductor 125 may be different portions of a plating layer (e.g., an electrolytic copper foil) disposed in contact with the circuit pattern 121. This will be discussed again with reference to FIG. 10.

In the illustrated embodiment of the disclosure, the conductive pad 123 is illustrated as being disposed at a position corresponding to the via hole 23 or the via conductor 125, but it should be noted that various embodiments of the disclosure are not limited thereto. In an embodiment of the disclosure, the wiring layer 102 in the rigid region RR1 or RR2 may include an additional plating layer disposed to correspond to the extended trajectory of the circuit pattern 121, and the conductive pad 123 may be a portion corresponding to the via hole 23 or the via conductor 125 among the plating layers formed in the rigid regions (RR1 and RR2). In another embodiment of the disclosure, an additional circuit pattern not shown in addition to the circuit pattern 121 formed of a rolled copper foil in the rigid regions (RR1 and RR2) may be provided, and the additional circuit pattern may include at least a portion of the electrolytic copper foil (e.g., a plating layer).

Figure 4:
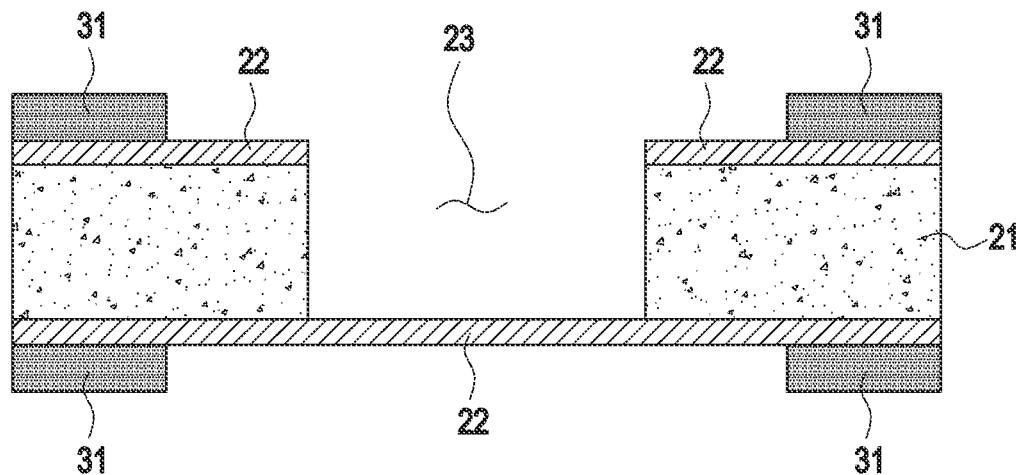
FIGS. 4, 5, 6, 7, 8, and 9 sequentially illustrate a process of fabricating a printed circuit board according to various embodiments of the disclosure.
Figure 5:
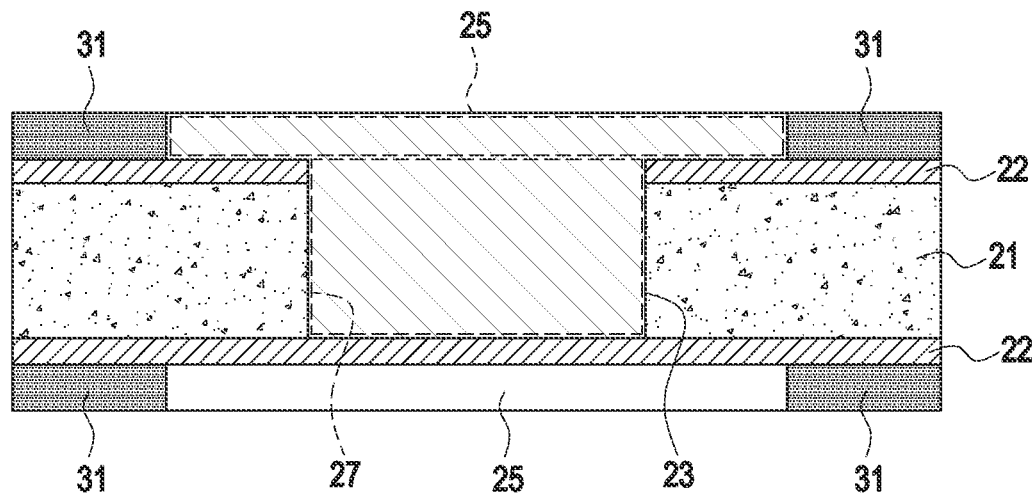

According to various embodiments of the disclosure, when a plating layer (e.g., the via conductor 125 and/or the conductive pad 123) is formed, in the flexible region (FR), a plating mask 131 (e.g., the plating mask 131 of FIG. 4) may be provided on the surface of the circuit pattern 121 or the surface of the rolled copper foil (e.g., the rolled copper foil 22 of FIG. 4). For example, in the flexible region (FR), the circuit pattern 121 or the rolled copper foil 22 may be substantially hidden to block growth of the plating layer (e.g., the conductive pad 123). Accordingly, flexibility in the flexible region (FR) may be secured, and the via conductor 125 and/or the conductive pad 123 for electrically connecting the circuit patterns 121 may be disposed in the rigid region (RR1 or RR2). In one embodiment of the disclosure, the plating mask 131 may be removed after the plating layer is formed, and the plating mask 131 may not exist in the completed printed circuit board 100.

According to various embodiments of the disclosure, various electrical/electronic components (e.g., an integrated circuit chip 241*a* of FIG. 12) may be disposed in the rigid region (RR1 or RR2) of the printed circuit board 100 and/or the insulation layer 101. The circuit pattern(s) 121 of the flexible region (FR) may electrically connect the electrical/electronic component(s) to other electrical/electronic component(s) (e.g., a camera module 251 or the sensor module 253 of FIG. 11) not disposed on the printed circuit board 100 or other electrical/electronic component(s) disposed in the second rigid region (RR2). In an embodiment of the disclosure, the first rigid region (RR1) among the rigid regions (RR1 and RR2) of the printed circuit board 100 and/or the insulation layer 101 may be disposed on one of different structures of an electronic device (e.g., an electronic device 200 of FIG. 11), and the flexible region (FR) may be disposed to transverse or connect between the different structures. In an embodiment of the disclosure, the second rigid region (RR2) among the rigid regions (RR1 and RR2) of the printed circuit board 100 and/or the insulation layer 101 may be disposed on one of different structures of an electronic device, and the flexible region (FR) may provide a connection wiring between the first rigid region (RR1) and the second rigid region (RR2).

According to various embodiments of the disclosure, the printed circuit board 100 may be provided, for example, as a wiring member in the electronic device of Republic of Korea Patent Publication No. 10-2020-0092586 (Published on Aug. 4, 2020, US Patent Publication No. 2020/0245481, published on Jul. 30, 2020) filed by the applicant, as a wiring member of a foldable electronic device and/or a wearable electronic device to be described later (e.g., the electronic device 200 of FIG. 11). Various embodiments of the disclosure may include the configuration of the above-referenced published patent, but may not include a description or configuration that is clearly inconsistent with the various embodiments of the disclosure. In one embodiment of the disclosure, the rigid region(s) (RR1 and RR2) of the printed circuit board 100 and/or the insulation layer 101 may disposed on one of housing structures of a foldable electronic device or disposed on either a wearable member (e.g., a wearing member 203 of FIG. 11) or a lens frame (e.g., the lens frame 202 of FIG. 11) of a wearable electronic device, and the flexible region (FR) may be disposed to transverse a folding region or a hinge structure of a display. According to one embodiment of the disclosure, when structures of an electronic device move or rotate relative to each other, the flexible region (FR) may be deformed into a flat shape or a curved shape. In the printed circuit board 100, the circuit pattern 121 may be formed of a rolled copper foil to have superior durability than that of the electrolytic copper foil, against the repeated bending deformation of the flexible region (FR).

Hereinafter, a method for fabricating the printed circuit board 100 will be described with reference to FIG. 3. In discussing a method for fabricating the printed circuit board 100 according to various embodiments of the disclosure, reference may be made to the embodiments of FIGS. 1 and 2. FIGS. 4 to 10 may be further referred to with respect to a product or a fabricated product according to each operation(s) of the fabrication method.

Figure 3:
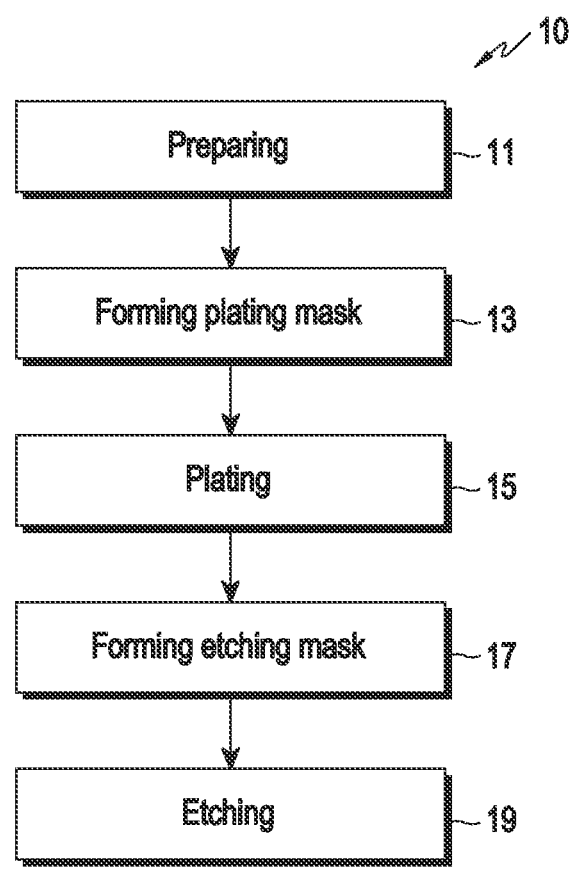
FIG. 3 is a flowchart illustrating a method of fabricating a printed circuit board according to an embodiment of the disclosure.

FIG. 3 is a flowchart illustrating a fabrication method 10 of a printed circuit board according to an embodiment of the disclosure.

FIGS. 4, 5, 6, 7, 8, and 9 sequentially illustrate a process of fabricating a printed circuit board according to various embodiments of the disclosure.

Figure 9:
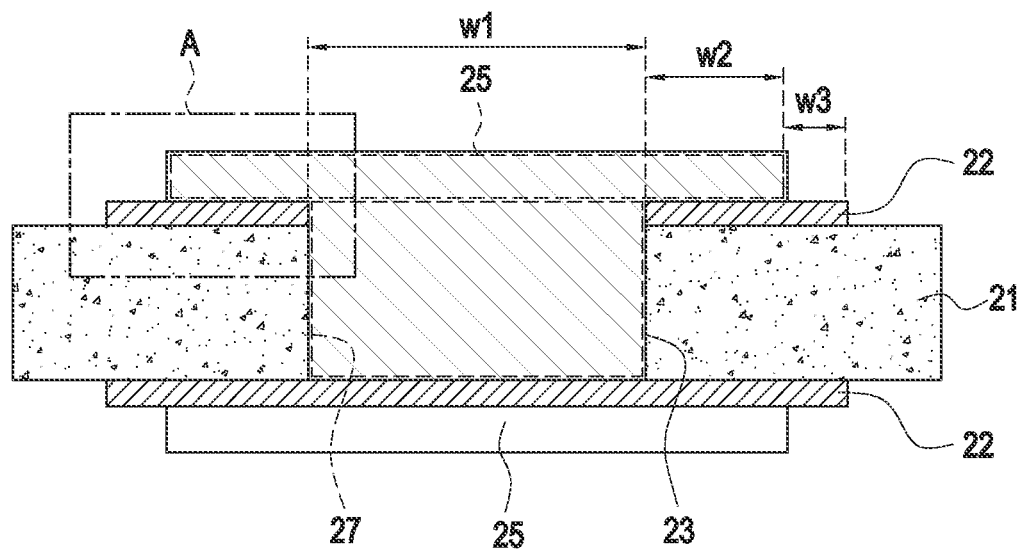
Figure 10:
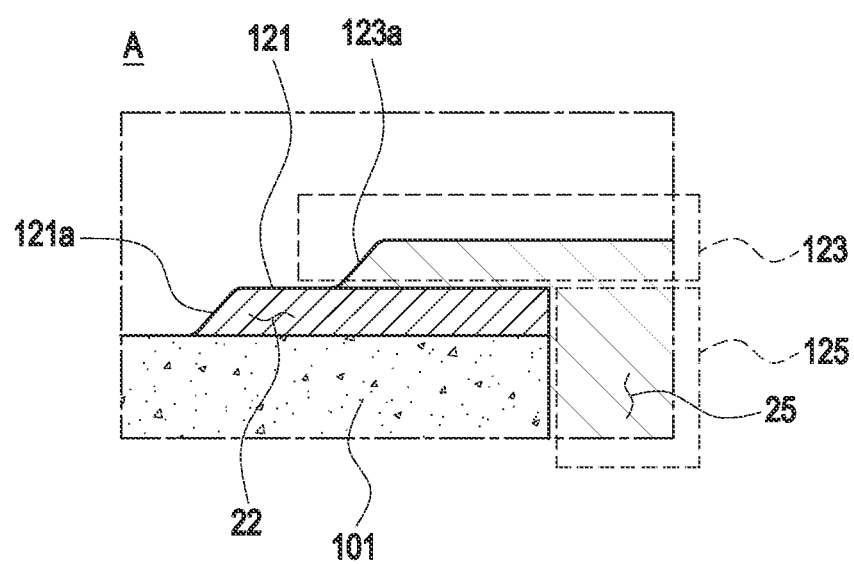
FIG. 10 is an enlarged view of a region indicated by 'A' of FIG. 9 according to an embodiment of the disclosure.

FIG. 10 is an enlarged view of a region indicated by 'A' of FIG. 9 according to an embodiment of the disclosure.

Referring to FIG. 3, a fabrication method 10 of the printed circuit board 100 according to various embodiments of the disclosure may include a preparing operation 11, a plating mask forming operation 13, a plating operation 15, and an etching mask forming operation 17, and/or an etching operation 19, and after each operation(s) is executed, a cleaning/washing operation may be performed as needed. In the illustrated embodiment of the disclosure, a circuit pattern (e.g., the circuit pattern 121 of FIG. 1 or 2) or a conductive pad (e.g., the conductive pad 123 of FIG. 1 or 2) is disposed on at least one surface of one insulation layer (e.g., the insulation layer 101 of FIG. 1 or 2), but various embodiments of the disclosure are not limited thereto. The printed circuit board 100 may include one to six wiring layers 102 (e.g., the circuit patterns 121) and a corresponding number of insulation layers 101, and the circuit pattern(s) 121 may be disposed on different surfaces of the insulation layer(s) 101. As mentioned above, the number of the wiring layers 102 and the insulation layers 101 are not limited to those illustrated in the disclosure, and may be determined by various combinations.

According to various embodiments of the disclosure, in the preparing operation 11 as an operation of preparing insulation layer(s) 21 and/or the rolled copper foil 22 and laminating the insulation layer 21 and the rolled copper foil 22, the insulation layer 21 and the rolled copper foil 22 may be fabricated in a film form through different processes. In laminating the insulation layer 21 and the rolled copper foil 22, the rolled copper foil 22 may be disposed on at least one surface of the insulation layer 21 by a roll laminating method or a press method in the preparing operation 11. In an embodiment of the disclosure, the insulation layer 21 may include a rigid region (e.g., the rigid region (RR1 or RR2 of FIG. 1) and a flexible region (e.g., the flexible region FR of FIG. 1) before lamination. In another embodiment of the disclosure, after a plating layer (e.g., the plating layers 25 and 27 of FIG. 5) to be described later is formed, or after the above-described insulation layer 111 of FIG. 1 is formed, a portion of the insulation layer 21 may be configured as a rigid region (RR1 or RR2) and at least the other portion may be configured as a flexible region (FR).

According to various embodiments of the disclosure, the rolled copper foil 22 on at least one surface of the insulation layer 21 may be attached to a partial surface of the insulation layer 21 or attached to the entire surface of the insulation layer 21. According to one embodiment of the disclosure, the preparing operation 11 may further include an operation of forming a via hole 23. The via hole 23 may be formed through at least a portion of the insulation layer 101 in the rigid region (e.g., the rigid region (RR1 or RR2) of FIG. 1). In an embodiment of the disclosure, for example, as illustrated in FIG. 4, the via hole 23 may penetrate the rolled copper foil 22 on one surface of the insulation layer 21, and one end of the via hole 23 may be closed by another rolled copper foil 22 adjacent to the other surface of the insulation layer 21.

According to various embodiments of the disclosure, in the plating mask forming operation 13, a plating mask 31 may be disposed on at least a portion of the surface of the rolled copper foil 22. Further referring FIG. 4, at least around the via hole 23 or in a region corresponding to the via hole 23, the plating mask 31 may expose at least a portion of the rolled copper foil 22 to the outside. According to one embodiment of the disclosure, the plating mask 31 may be formed by exposing and developing a portion of a photoresist or dry film including a photosensitive material in a state in which the photoresist or dry film is disposed on or attached to the surface of the rolled copper foil 22. For example, a portion of the photoresist or dry film may be removed from a desired region where a plating layer (e.g., the plating layer 25 or 27 of FIG. 5) is disposed, so that the plating mask 31 may expose a portion of the rolled copper foil 22 to the outside.

According to various embodiments of the disclosure, in the plating operation 15 as an operation of forming an electrolytic copper foil, for example, the plating layer 25 or 27, on a portion exposed to the outside of the plating mask 31, the plating layer 25 or 27 may be grown by using the rolled copper foil 22 exposed to the outside of the plating mask 31 as a seed. For example, outside the via hole 23, the plating layer 25 or 27 may be grown in contact with the rolled copper foil 22 on one surface (e.g., the upper surface)

of the insulation layer 21, and inside the via hole 23, the plating layer 25 or 27 may be grown from the rolled copper foil 22 on the other surface (e.g., the lower surface) of the insultation layer 21. In one embodiment of the disclosure, on the lower surface of the insulation layer 21, an additional plating layer 25 may be grown or formed from the surface of the rolled copper foil 22 to be disposed outside the via hole 23. Further referring to FIG. 5, inside the via holes 23, the plating layer 25 or 27 may be provided as a via conductor 27 (e.g., the via conductor 125 of FIG. 1 or FIG. 2), and outside the via hole 23, the plating layer 25 or 27 may be provided as a conductive pad 25 (e.g., the conductive pad 123 of FIG. 1 or FIG. 2).

According to various embodiments of the disclosure, the via conductor 27 (e.g., the via conductor 125 of FIG. 1 or. 2) may be used for electrically connecting the rolled copper foils 22 or circuit patterns (e.g., the circuit patterns 121 of FIG. 1 or. 2) disposed on different surfaces of the insulation layer 21 or disposed on different insulation layers 21 (e.g., the insulation layers 101 of FIG. 1). In an embodiment of the disclosure, the conductive pad 25 (e.g., the conductive pad 123 of FIG. 1 or 2) may more stably maintain the connection between the via conductor 27 and the circuit pattern 121 (or the rolled copper foil 22). In another embodiment of the disclosure, the plating layer grown from the rolled copper foil 22 exposed to the outside from the other surface of the insulation layer 21 (e.g., the lower surface of FIG. 5 or 6) may form another conductive pad 25 (e.g., the conductive pad 123 of FIG. 1 or 2).

Figure 6:
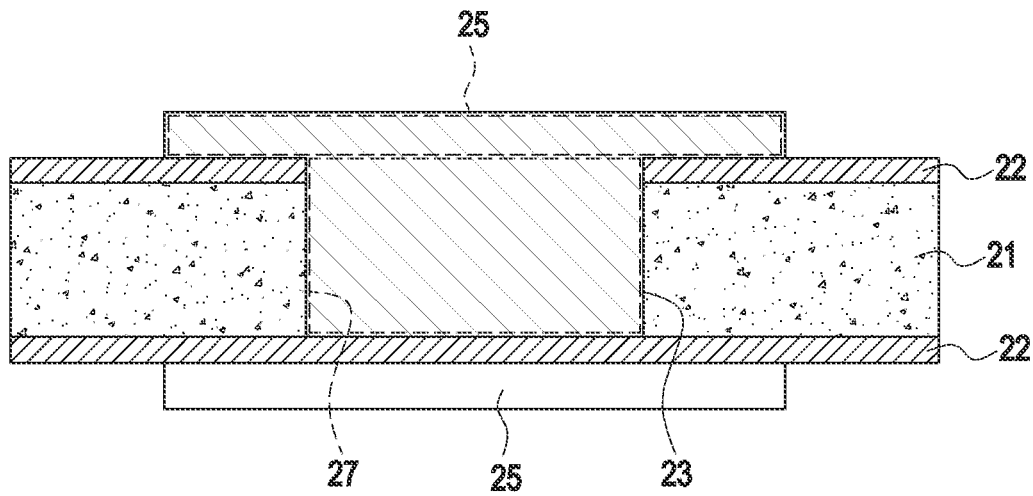

According to various embodiments of the disclosure, after the plating layer 25 or 27 right for a designed specification is formed, the plating mask 31 may be removed as illustrated in FIG. 6. In the illustrated embodiment of the disclosure, the plating layer 25 or 27 is substantially disposed inside the via hole 23 or disposed on the surface of the rolled copper foil 22 in a region corresponding to the via hole 23, but the various embodiments of the disclosure are not limited thereto. In an embodiment of the disclosure, the plating layer 25 or 27 may be further formed on at least a portion of the surface of the rolled copper foil 22 in the rigid region (e.g., the rigid region (RR1 or RR2) of FIG. 1). For example, the wiring layer 102 in the rigid region (RR1 or RR2) may further include an additional conductive layer, which may not be shown, along a signal line provided by the circuit pattern 121. As will be described later, the edge or side surface of the electrolytic copper foil after the etching operation 19 may be formed to be at least partially inclined with respect to the surfaces of the insulation layer 21 or 101. In one embodiment of the disclosure, either before the etching operation 19 or after the plating mask 31 is removed, as illustrated in FIG. 6, the edge or side surface of the plating layer 25 may be formed substantially perpendicular to the surface of the insulation layer 21 or the surface of the rolled copper foil 22.

Figure 7:
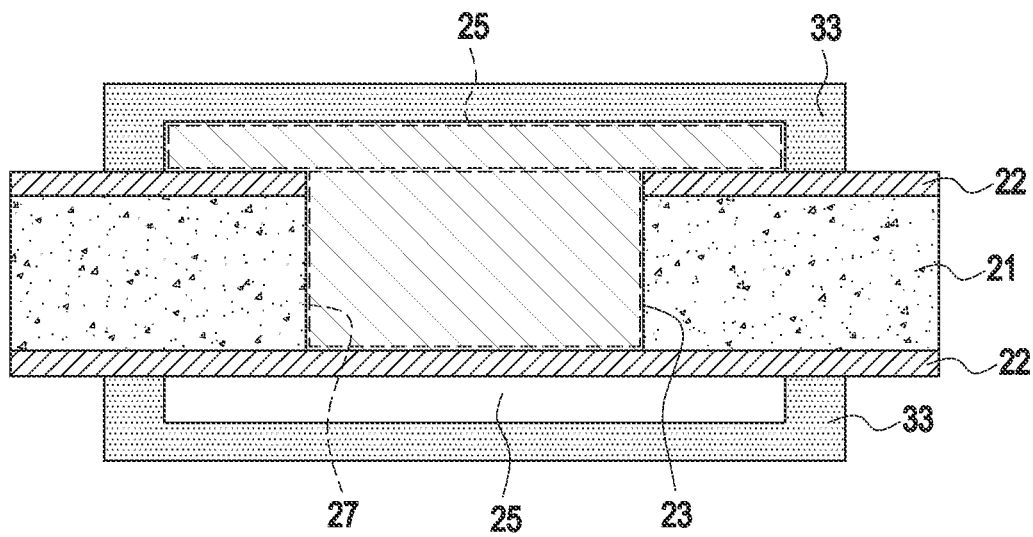

According to various embodiments of the disclosure, in the etching mask forming operation 17 as an operation of forming an etching mask (e.g., an etching mask 33 of FIG. 7 or 8) corresponding to a designed signal line/wiring on the surface of the plating layer 25 or 27 or the surface of the rolled copper foil 22, after disposing or attaching a photoresist or dry film, the etching mask 33 may be formed by exposure and development. After the etching mask 33 is formed, a portion of the plating layer 25 or 27 or a portion of the rolled copper foil 22 may be exposed to the outside. For example, as illustrated in FIG. 7, a portion of the plating layer 25 or 27 or a portion of the rolled copper foil 22 that will not be used as a signal line or wiring (e.g., the wiring layer 102 of FIG. 1 or 2) may be exposed to the outside of the etching mask 33.

Figure 8:
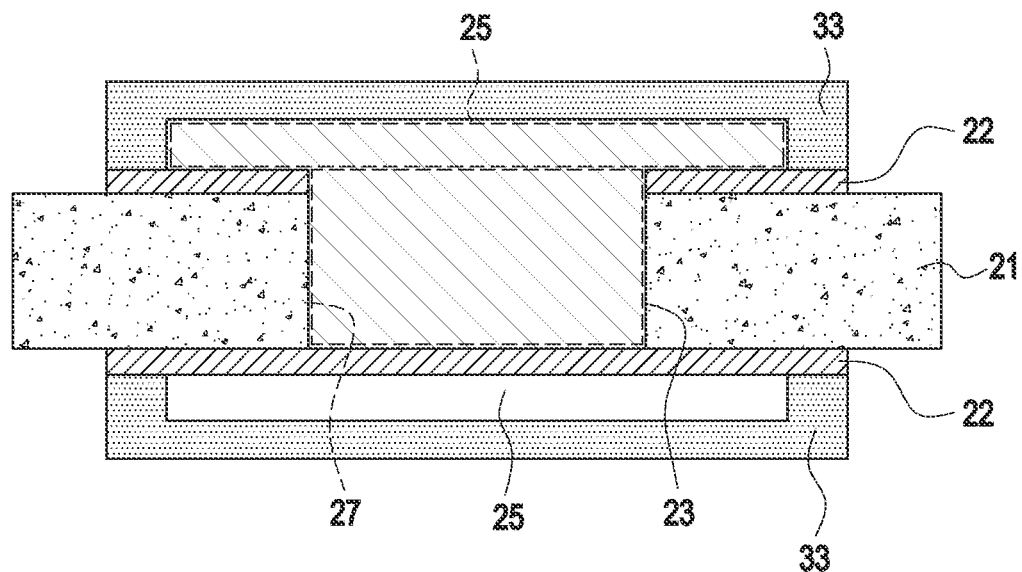

According to various embodiments of the disclosure, in the etching operation 19, a portion of the plating layer 25 or 27 or a portion of the rolled copper foil 22 exposed to the outside of the etching mask 33 may be removed using an etching solution selected based on the components of the rolled copper foil 22 or the electrolytic copper foil (or the plating layer 25 or 27). For example, the etching mask 33 may protect the portion corresponding to the designed signal line/wiring among the plating layer 25 or 27 or the rolled copper foil 22 from the etching solution. After the etching operation 19, as illustrated in FIG. 8, a portion (e.g., a portion exposed to the outside of the etching mask 33) among the plating layer 25 or 27 or the rolled copper foil 22 may be removed, and a portion protected by the etching mask 33 may remain on the surface of the insulation layer 21 to be provided as a circuit pattern (e.g., the circuit pattern 121 of FIG. 1 or 2) or a conductive pad (e.g., the conductive pad 123 of FIG. 1 or 2).

According to various embodiments of the disclosure, after etching operation 19, etching mask 33 may be removed, and for fabricating a printed circuit board (e.g., the printed circuit board 100 of FIG. 1) including a plurality of insulation layers 21 (e.g., the insulation layer 101 of FIG. 1), an additional insulation layer may be laminated on the insulation layer 21 or 101 on which the circuit pattern 121 or the conductive pad 123 is disposed, and the operations of the above-described fabrication method may be sequentially repeated. Further referring to FIGS. 9 and 10, the width (W1) of the via hole 23 or the via conductor 27 or 125 may be approximately from 60 m to 100 m. In one embodiment of the disclosure, the width (e.g., the second width (W2)) from the edge of the via hole 23 or via conductor 27 or 125 to the edge of the conductive pad 25 or 123 may be approximately 85 m. In an embodiment of the disclosure, the second width (W2) may be greater than 85 m. In another embodiment of the disclosure, the width (e.g., the third width (W3)) from the edge of the conductive pad 25 or 123 to the edge of the rolled copper foil 22 (e.g., the circuit pattern 121) may be approximately 45 m. In an embodiment of the disclosure, the third width (W3) may be greater than 45 m.

According to various embodiments of the disclosure, the thickness of the wiring layer 102 in the rigid region (e.g., the rigid region (RR1 or RR2) of FIG. 1) may be approximately 1.5 times to 4.0 times than the thickness of the wiring layer 102 in the flexible region (FR). Here, the 'thickness' may refer to a height from the surface of the insulation layer 21 or 101 to the surface of the wiring layer 102 (e.g., the circuit pattern 121 and/or the conductive pad 25 or 123). In one embodiment of the disclosure, the wiring layer 102 or the circuit pattern 121 may include a conductive line for transmitting a signal or power or a conductive layer providing a ground. In another embodiment of the disclosure, the rolled copper foil 22 or the circuit pattern 121 may be disposed to at least partially transverse the flexible region (FR) while extending generally from the rigid region (RR1 or RR2), and the conductive pad 25 or 123 may be disposed on at least a portion of the surface of the circuit pattern 121 within the rigid region (RR1 or RR2). In an embodiment of the disclosure, even in the rigid region (RR1 or RR2), the thickness of the wiring layer 102 of the portion where the conductive pad 25 or 123 is not formed may be substantially equal to the thickness of the circuit pattern 121 in the flexible region (FR). In one embodiment of the disclosure, the conductive pad 25 or 123 may be formed to be at least approximately 0.5 times the thickness of the circuit pattern 121. In another embodiment of the disclosure, the conductive pad 25 or 123 may be formed to have a thickness of approximately 3.0 times the thickness of the circuit pattern 121, and in a portion where the circuit pattern 121 overlaps with the conductive pad 25 or 123, the thickness of the wiring layer 102 may substantially amount to approximately 4.0 times the thickness of the circuit pattern 121. Accordingly, the flexible region (FR) of the printed circuit board 100 or the insulation layer 21 or 101 may flexibly deform more than the rigid region(s) (RR1 and RR2).

According to various embodiments of the disclosure, after the etching operation 19 or after the etching mask 33 is removed, the edge or side surface 121a of the rolled copper foil 22 (e.g., the circuit pattern 121) may be formed to be at least partially inclined with respect to the surface of the insulation layer 21 or 101. This is a phenomenon caused by the chemical reaction of the rolled copper foil 22 with respect to an etching solution, and may not substantially affect the performance or electrical characteristics of the printed circuit board 100. According to another embodiment of the disclosure, after the etching operation 19, or after the etching mask 33 is removed, the edge or the side surface 123a of the electrolytic copper foil (e.g., the conductive pad 25 or 123) may be formed to be at least partially inclined with respect to the surface of the insulation layer 21 or 101 or the surface of the circuit pattern 121. This is a phenomenon caused by the chemical reaction of the electrolytic copper foil with respect to an etching solution, and may not substantially affect the performance or electrical characteristics of the printed circuit board 100.

Figure 11:
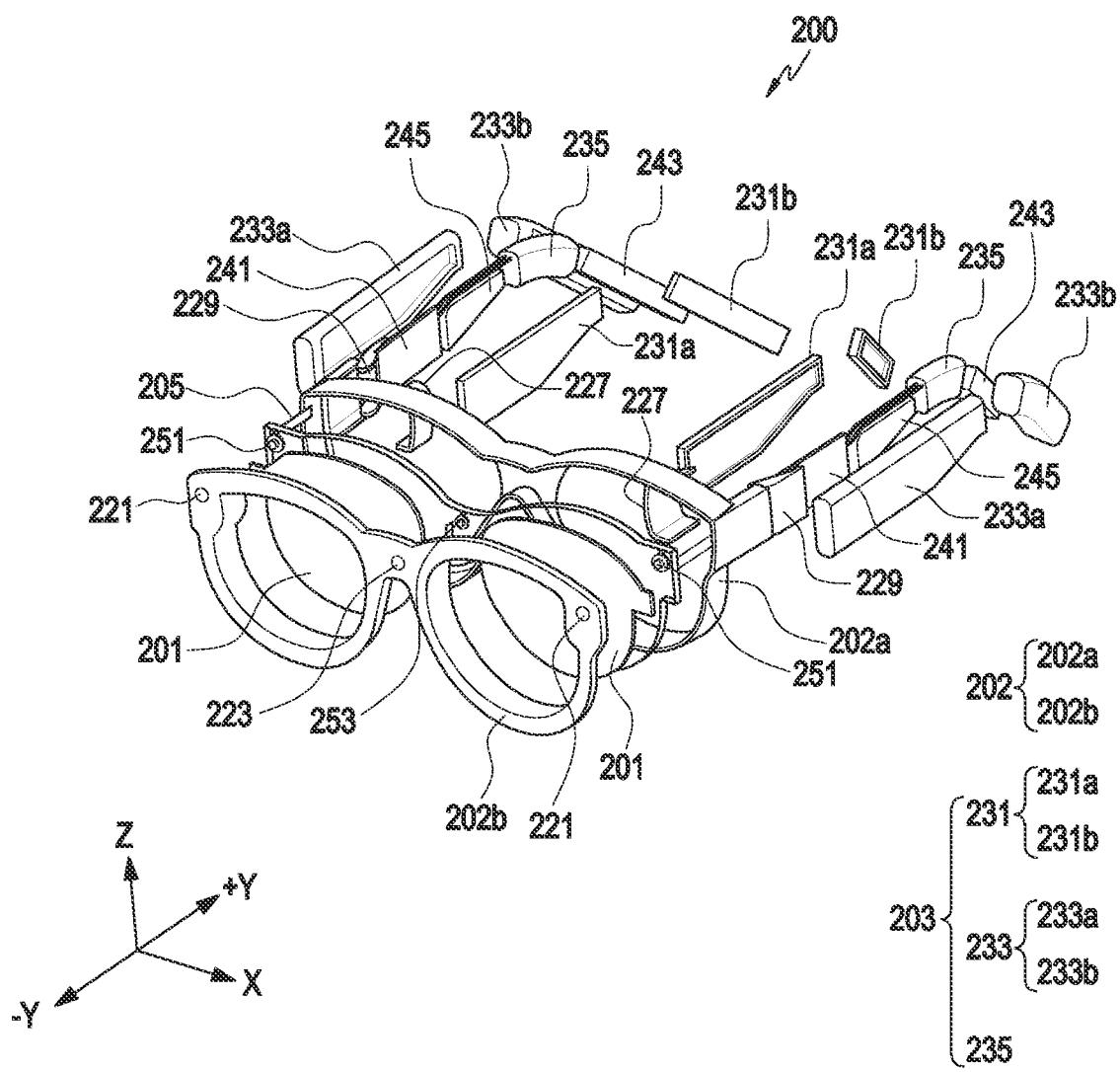
FIG. 11 is an exploded perspective view illustrating an electronic device including a printed circuit board according to an embodiment of the disclosure.

FIG. 11 is an exploded perspective view illustrating an electronic device including a printed circuit board according to an embodiment of the disclosure.

Figure 12:
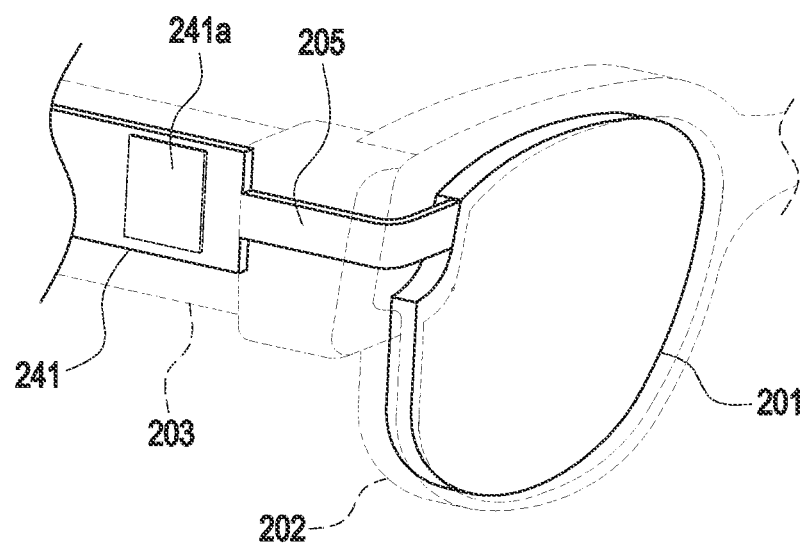
FIG. 12 is an enlarged view of a portion of an electronic device including a printed circuit board according to an embodiment of the disclosure.

FIG. 12 is an enlarged view of a portion of an electronic device including a printed circuit board according to an embodiment of the disclosure. In discussing FIGS. 11 and/or 12, reference may be made to the printed circuit board 100 of FIG. 1.

Referring to FIGS. 11 and 12, the electronic device 200 is a wearable electronic device in the form of glasses, and a user may visually recognize surrounding objects or environments even while wearing the electronic device 200. The electronic device 200 may acquire or recognize a visual image about an object or environment in a direction (e.g., the −Y direction) in which the electronic device 200 is oriented or a user looks using a camera module 251, and may receive information on an object or an environment provided from an external electronic device or a service provider via a network. In another embodiment of the disclosure, the electronic device 200 may provide the received information (e.g., information on an object or environment) to the user in an acoustic or visual form. For example, the electronic device 200 may provide the provided information on an object or environment to the user in a visual form through a lens 201 by using a display module (not shown). The electronic device 200 may implement augmented reality when information on an object or environment is implemented in a visual form and combined with an actual image of a user's surrounding environment. In the following detailed description, various references may be made to "a state or location in which an electronic device or a specified element of the electronic device faces the user's face", which is on the assumption that a user wears the electronic device 200.

According to various embodiments of the disclosure, the electronic device 200 may include at least one lens 201, a lens frame 202, and/or a wearing member 203, and according to an embodiment of the disclosure, the pair of lenses 201 may be provided so as to be disposed to correspond to the left eye and the right eye of a user, respectively, while the electronic device 200 is worn on the user's body. In an embodiment of the disclosure, the electronic device 200 may include one lens 201, and in this case, the lens 201 may be disposed to correspond to one of the left eye and the right eye of a user. In another embodiment of the disclosure, the electronic device 200 may have a shape (e.g., a shape of goggle) including one lens 201 corresponding to the left eye and the right eye.

According to various embodiments of the disclosure, the lens 201 may receive external light and focus or guide the same to the left or right eye of a user. Although not shown, the lens 201 may include an optical waveguide structure, and an image (e.g., an image obtained by visually implementing information on surrounding object or environment) output from the display module may be provided to the user by using the optical waveguide structure.

According to various embodiments of the disclosure, the lens frame 202 is a structure for fixing at least one of the lenses 201, and may be supported or positioned on the user's face while the user wears the electronic device 200. For example, at least one of the lenses 201 may be positioned by the lens frame 202 to correspond to the user's naked eye. In one embodiment of the disclosure, the lens frame 202 may contain a polymer, such as polycarbonate, or a metallic material. In one embodiment of the disclosure, when the lens frame 202 contains a metallic material, the electronic device 200 may perform wireless communication by using a metallic material portion of the lens frame 202.

According to various embodiments of the disclosure, the lens frame 202 may include a first frame 202a disposed to face the user's face, and a second frame 202b coupled to the first frame 202a such that the first frame 202a and the second frame 202b face each other. For example, in a state in which the user wears the electronic device 200, the first frame 202a may be disposed to face the user's face, and the second frame 202b may be disposed to face in a direction opposite to the first frame 202a, for example, a direction in which the user looks. In one embodiment of the disclosure, the lenses 201 may be disposed on the lens frame 202 while having at least a portion of the edge thereof positioned between the first frame 202a and the second frame 202b. For example, the first frame 202a and the second frame 202b may be coupled to face each other such that the edge of at least one of the lenses 211 is bound or fixed therebetween. In an embodiment of the disclosure, the lens frame 202 may have a shape exposing a portion of the side surface of the lens 201 to the external environment, and in the illustrated embodiment of the disclosure, may have a closed curve shape surrounding the lens 201.

According to various embodiments of the disclosure, the electronic device 200 may include a camera module 251 and/or a sensor module 253 disposed on the lens frame 202. A flexible printed circuit board 205 (e.g., the flexible region (FR) of the printed circuit board 100 of FIG. 1) may extend from the circuit board 241 (e.g., the first rigid region (RR1) among the rigid regions (RR1 and RR2) of FIG. 1) received in the wearing member 203 and may electrically connect the camera module 251 and/or the sensor module 253 disposed on the lens frame 202 to the circuit board 241. The camera module 251 may acquire an image of a surrounding object or environment through a first optical hole 221 formed in the second frame 202b. The camera module 251 and/or the first optical hole 221 may be disposed at each of both side ends of the lens frame 202 (e.g., the second frame 202b), for example, at each of both ends of the lens frame 202 (e.g., the second frame 202b) in the X direction. A processor (not shown) of the electronic device 200 may recognize an object or environment, based on an image acquired through the camera module 251. In an embodiment of the disclosure, the electronic device 200 may transmit an image acquired through the camera module 251 to an external electronic device or a wireless communication service provider to request information on the corresponding image.

According to various embodiments of the disclosure, the flexible printed circuit board 205, for example, the flexible region (FR) of the printed circuit board 100, may extend from one (e.g., the circuit board 241) of the rigid regions (RR1 and RR2) and transverse a hinge structure 229 to extend into the lens frame 202, and may be disposed on at least a portion of the periphery of the lens 201 in the lens frame 202. In one embodiment of the disclosure, the second rigid region (RR2) among the rigid regions (RR1 and RR2) of FIG. 1 may be disposed inside the lens frame 202. In an embodiment of the disclosure, the camera module 251 and/or the sensor module 253 may be electrically connected inside the lens frame 202 to the second rigid region (RR2) among the rigid regions (RR1 and RR2) or the flexible region (FR) while being disposed substantially inside the lens frame 202.

According to various embodiments of the disclosure, the sensor module 253 may include a proximity sensor, and may be electrically connected to the circuit board 241 through the flexible printed circuit board 205 (e.g., the flexible region (FR)). According to an embodiment of the disclosure, the flexible printed circuit board 205 may include a branched structure inside the lens frame 202, and a branched flexible printed circuit board 205 or a portion of flexible region (FR) may be directly connected to the camera module 251 and/or the sensor module 253. The sensor module 253 may detect through a second optical hole 223 formed in the second frame 202b whether the user's body (e.g., a finger) approaches the lens 201 or is maintained in a proximity state to the lens 201 within a certain distance. The sensor module 253 and/or the second optical hole 223 may be disposed in a center portion of the lens frame 202, for example, between the camera module 251 in the X direction. In the embodiment of the disclosure, the electronic device 200 is illustrated as including one sensor module 253 (e.g., a proximity sensor) and one second optical hole 223, but various embodiments are not limited thereto, and the number and/or positions of the sensor modules 253 and the second optical holes 223 may be variously changed in order to more accurately detect the approach or proximity state of the user's body.

According to various embodiments of the disclosure, when an approach of the user's body is detected through the sensor module 253 (e.g., a proximity sensor), the electronic device 200 may be configured to perform a specified function. In an embodiment of the disclosure, the sensor module 253 may include a gaze tracking sensor which is not shown. For example, the electronic device 200 may track the user's gaze by using the gaze tracking sensor, and may adjust the position and/or size of an image provided to the user through the lens 201 according to the user's gaze.

According to various embodiments of the disclosure, the electronic device 200 may include a pair of wearing members 203. Each of the wearing members 203 may extend from the lens frame 202 and may be partially supported or positioned on the user's body (e.g., the ear) together with the lens frame 202. In one embodiment of the disclosure, the wearing member 203 may be rotatably coupled to the lens frame 202 through a hinge structure 229, and in a state in which the electronic device 200 is not worn on a user, the wearing member 203 may be folded to overlap the lens frame 202 to be convenient carried or stored. A portion of the hinge structure 229 may be mounted on the lens frame 202, and the other portion may be received or mounted into the wearing member 203. A hinge cover 227 may be mounted on the lens frame 202 to hide a portion of the hinge structure 229, and the other portion of the hinge structure 229 may be received or hidden between an inner case 231 and an outer case 233 which are to be described later.

According to various embodiments of the disclosure, when the wearing member 203 is folded to overlap the lens frame 202 or unfolded at a specified angle from the lens frame 202, the flexible region (FR) (e.g., the flexible printed circuit board 205) may be bent and deformed. According to one embodiment of the disclosure, the circuit pattern (e.g., the circuit pattern 121 of FIG. 1) in the flexible region (FR) is a signal wiring based on a rolled copper foil, and may have superior durability than the signal wiring based on electrolytic copper foil, against repeated bending deformation of the flexible region (FR) or the flexible printed circuit board 205.

According to various embodiments of the disclosure, the electronic device 200 may include various electrical/electronic components positioned on the wearing member 203, for example, a circuit board 241 (e.g., one among the rigid regions (RR1 and RR2) of FIG. 1), a battery 243, a camera module 251, a display module (not shown), and/or a speaker module 245. The various electrical/electronic components accommodated in the wearing member 203 may be electrically connected through a circuit board (e.g., the circuit board 241, a flexible printed circuit board (e.g., the flexible printed circuit board 205 or the printed circuit board 100 of FIG. 1), a conductive cable, or connector. In one embodiment of the disclosure, the electronic device 200 may further include a second flexible region (e.g., the flexible region (FR) of FIG. 1) disposed in the wearing member 203 while extending from the circuit board 241, and the second flexible region may connect the battery 243 or the speaker module 245 to the circuit board 241.

According to various embodiments of the disclosure, positions of electrical/electronic components within the wearing member 203 may be variously changed such that the weight of the electronic device 200 may be evenly distributed while the electronic device 200 is worn. For example, within the wearable member 203, the circuit board 241 may be disposed adjacent to the lens frame 202, and an electrical/electronic component (e.g., the battery 243) which is heavier than the circuit board 241 may be disposed farther from the lens frame 202 than a circuit board 241. For example, when the electronic device 200 is worn, the concentration of the weight thereof toward the lens frame 202 or on the user's face can be alleviated. The speaker module 245 may be disposed in the wearing member 203 between the circuit board 241 and the battery 243 to be positioned close to the user's ear while the user wears the electronic device 200. In one embodiment of the disclosure, at least one integrated circuit chip may be mounted on the circuit board 241, and various circuit devices including a processor may be provided on the integrated circuit chip 241a (see FIG. 12).

According to various embodiments of the disclosure, the wearing member 203 may include an inner case 231 and an outer case 233 which are made of a polymer material or a metal material. The inner case 231 may be, for example, a case configured to be in direct contact with the user's body, and the outer case 233 may be coupled to the inner case 231 such that the outer case 233 and the inner case 231 face each other and may be disposed toward the outer space. In one embodiment of the disclosure, materials of the inner case 231 and the outer case 233 may be appropriately selected such that when heat is generated by specific components of the electrical/electronic components accommodated in the wearing member 203, the heat is blocked from being transferred to the user's body and is induced to be discharged to the outside.

In one embodiment of the disclosure, the circuit board 241 or the speaker module 245 may be accommodated in a space of the wearing member 203 to be separated from the battery 243. In the illustrated embodiment of the disclosure, the inner case 231 may include a first case 231a including the circuit board 241 or the speaker module 245, and a second case 231b configured to accommodate the battery 243, and the outer case 233 may include a third case 233a coupled to the first case 231a such that the third case 233a and the first case 231a face each other, and a fourth case 233b coupled to the second case 231b such that the fourth case 233b and the second case 231b face each other. For example, the first case 231a and the third case 233a may be coupled to each other (hereinafter, 'a first case section 231a and 233a') to accommodate the circuit board 241 or the speaker module 245, and the second case 231b and the fourth case 233b may be coupled to each other (hereinafter, 'second case section 231b and 233b') to accommodate the battery 243.

According to various embodiments of the disclosure, the first case section 231a and 233a may be rotatably coupled to the lens frame 202 through the hinge structure 229, and the second case section 231b and 233b may be connected or mounted to the end of the first case section 231a and 233a through a connection member 235. In an embodiment of the disclosure, of the connection member 235, a portion which is in contact with the user's body may be made of a material having low conductivity, for example, an elastic material, such as silicone, polyurethane, or rubber, and a portion which is not in contact with the user's body may be made of a material having high thermal conductivity (e.g., a metal material). For example, when heat is generated from the circuit board 241 or the battery 243, the connection member 235 may block the heat from being transferred to the portion in contact with the user's body, and may disperse and release the heat through the portion not in contact with the user's body. In an embodiment of the disclosure, a portion of the connection member 235 configured to be in contact with the user's body may be interpreted as a portion of the inner case 231, and a portion of the connection member 235 configured to be not in contact with the user's body may be interpreted as a portion of the outer case 233.

As described above, according to various embodiments of the disclosure, a printed circuit board (e.g., the printed circuit board 100 of FIG. 1) and/or an electronic device (e.g., the electronic device 200 of FIG. 11) including the same may include at least one insulation layer (e.g., the insulation layer 101 or 21 of FIG. 1, 2, 9, or 10) including a first rigid region (e.g., one of the rigid regions (RR1 and RR2) of FIG. 1) and a flexible region (e.g., the flexible region (FR) of FIG. 1) extending from the first rigid region, at least one first circuit pattern (e.g., the circuit pattern 121 of FIGS. 1, 2 and 10 or the rolled copper foil 22 of FIG. 9) disposed on one surface of the insulation layer to at least partially transverse the flexible region from the first rigid region, and at least one conductive pad (e.g., the conductive pad 123 or 25 of FIG. 1, 2, 9 or 10) formed at least partially on a surface of the first circuit pattern in the first rigid region, and the flexible region may be configured to flexibly deform more than the first rigid region.

According to various embodiments of the disclosure, at least a portion of the first circuit pattern may include at least a portion of an electrically conductive film laminated on the surface of the insulation layer, and the conductive pad may include a plating layer (e.g., the plating layer 25 or 27 of FIG. 9) at least partially formed on the surface of the first circuit pattern.

According to various embodiments of the disclosure, the sum of thicknesses of the conductive pad and the first circuit pattern from the surface of the insulation layer in the first rigid region may be 1.5 times to 4.0 times the thickness of the first circuit pattern in the flexible region.

According to various embodiments of the disclosure, the side surface (e.g., the side surface 123a of FIG. 10) of the conductive pad may be formed to be at least partially inclined with respect to the surface of the insulation layer or the surface of the first circuit pattern.

According to various embodiments of the disclosure, the insulation layer may further include a second rigid region (e.g., the other one of the rigid regions (RR1 and RR2) of FIG. 1) connected to the first rigid region through the flexible region, and the flexible region may be configured to flexibly deform more than the second rigid region.

According to various embodiments of the disclosure, the first circuit pattern may further include another portion disposed in the second rigid region.

According to various embodiments of the disclosure, the printed circuit board and/or the electronic device including the same, as described above, may further include at least one via conductor (e.g., the via conductor 125 or 27 of FIG. 1, 2, 9 or 10) formed through the insulation layer in the first rigid region, and the via conductor may include at least a portion of a plating layer integrally formed with the conductive pad.

According to various embodiments of the disclosure, the printed circuit board and/or the electronic device including the same, as described above, may further include a second circuit pattern (e.g., the lower circuit patterns among the circuit patterns 121 of FIG. 2) disposed on the other surface of the insulation layer so as to extend from the first rigid region and to at least partially transverse the other surface of the flexible region, and at least one via conductor formed through the insulation layer in the first rigid region, and the via conductor may be configured to electrically connect the second circuit pattern to the first circuit pattern.

According to various embodiments of the disclosure, the printed circuit board and/or the electronic device including the same, as described above, may further include at least one via hole (e.g., the via hole 23 of FIG. 9) formed through the insulation layer. The via conductor may include a plating layer formed on the at least one via hole while being in contact with the second circuit pattern, and the conductive pad may include a plating layer formed in contact with the first circuit pattern while being connected to the via conductor.

According to various embodiments of the disclosure, the plurality of the insulation layers may be sequentially stacked, and the plurality of the first circuit patterns may be formed between two adjacent insulation layers among the insulation layers or on at least a portion of a surface of an outermost insulation layer among the insulation layers, respectively.

According to various embodiments of the disclosure, the printed circuit board and/or the electronic device including the same, as described above, may include at least one via hole formed through at least one of the insulation layers, and a via conductor including a plating layer formed on the via hole, and the via conductor may be configured to electrically connect two adjacent first circuit patterns positioned on different layers among the first circuit patterns.

According to various embodiments of the disclosure, the conductive pad is a plating layer connected to the via conductor and may be formed in contact with one of the first circuit patterns.

According to various embodiments of the disclosure, an electronic device (e.g., the electronic device 200 of FIG. 11) may include a first housing (e.g., the wearing member 203 of FIG. 11), a second housing (e.g., the lens frame 202 of FIG. 11) coupled to the first housing and coupled to be rotatable with respect to the first housing, a hinge structure (e.g., the hinge structure 229 of FIG. 11) configured to rotatably couple the second housing to the first housing, and a printed circuit board (e.g., the printed circuit board 100 of FIG. 1 including the circuit board 241 and/or flexible printed circuit board 205 of FIG. 12), and the printed circuit board may include at least one insulation layer (e.g., the insulation layer 21 or 101 of FIG. 1, 2, 9, or 10) including a first rigid region (e.g., one of the rigid regions (RR1 and RR2) of FIG. 1) and a flexible region (e.g., the flexible region (FR) of FIG. 1) extending from the first rigid region, at least one first circuit pattern (e.g., the circuit pattern 121 or the rolled copper foil 22 of FIG. 1, 2, 9, or 10) disposed on one surface of the insulation layer to at least partially transverse the flexible region from the first rigid region, and at least one conductive pad (e.g., the conductive pad 123 or 25 of FIG. 1, 2, 9 or 10) formed at least partially on a surface of the first circuit pattern in the first rigid region, and the flexible region may be disposed to at least partially extend through a region in which the hinge structure is disposed and may be configured to flexibly deform more than the first rigid region.

According to various embodiments of the disclosure, the insulation layer may further include a second rigid region (e.g., the other one of the rigid regions (RR1 and RR2) of FIG. 1) connected to the first rigid region through the flexible region, and the first rigid region may be disposed in the first housing and the second rigid region may be disposed in the second housing.

According to various embodiments of the disclosure, the sum of thicknesses of the conductive pad and the first circuit pattern from the surface of the insulation layer in the first rigid region may be 1.5 times to 4.0 times the thickness of the first circuit pattern in the flexible region, and the side surface of the conductive pad may be formed to be at least partially inclined with respect to the surface of the insulation layer or the surface of the first circuit pattern.

According to various embodiments of the disclosure, a method (e.g., the fabrication method 10 of FIG. 3) for fabricating a printed circuit board, the method including preparing at least one insulation layer (e.g., the insulation layer 101 or 21 of FIG. 1, 2, 9, or 10) including a first rigid region (e.g., one of the rigid regions (RR1 and RR2) of FIG. 1) and a flexible region (e.g., the flexible region (FR) of FIG. 1) extending from the first rigid region (e.g., a part of the preparing operation 11 of FIG. 3), laminating an electrically conductive film (e.g., the rolled copper foil 22 of FIG. 4) on at least one surface of the insulation layer (e.g., a roll laminating or pressing process as a preparing operation 11 of FIG. 3), attaching a dry film to the surface of the electrically conductive film and removing a portion of the dry film therefrom to expose a portion of the electrically conductive film (e.g., the operation of FIG. 3 indicated by '13' as an operation of forming the plating mask 31 of FIG. 4), forming a plating layer (e.g., the plating layer 25 or 27 of FIG. 5) on at least a portion of the exposed surface of the electrically conductive film (e.g., the plating operation 15 of FIG. 3), exposing at least a portion of the electrically conductive film or at least a portion of the plating layer by removing the dry film and by forming an etching mask (e.g., the etching mask 33 of FIG. 7) (e.g., the etching mask forming operation 17 of FIG. 3), and etching and removing at least the exposed portion of the electrically conductive film or at least the exposed portion of the plating layer (e.g., the etching operation 19 of FIG. 3).

According to various embodiments of the disclosure, by the etching, at least one first circuit pattern (e.g., the circuit pattern 121 of FIG. 1, 2, or 10 or the rolled copper foil 22 of FIG. 9) may be formed on one surface of the insulation layer so as to at least partially transverse the flexible region from the first rigid region, and a conductive pad (e.g., the conductive pad 123 or 25 of FIG. 1, 2, 9, or 10) may be formed in the first rigid region so as to at least partially positioned on the surface of the first circuit pattern.

According to various embodiments of the disclosure, the first circuit pattern may be formed by a portion of the electrically conductive film, and the conductive pad may be formed by a portion of the plating layer.

According to various embodiments of the disclosure, the side surface (e.g., the side surface 123a of FIG. 10) of the conductive pad may be formed to be at least partially inclined with respect to the surface of the insulation layer or the surface of the first circuit pattern.

According to various embodiments of the disclosure, the fabrication method as described above may further include forming at least one via hole (e.g., the via hole 23 of FIG. 4) formed through the insulation layer before the plating, and in the plating, the plating layer may be at least partially formed in the at least one via hole.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A printed circuit board comprising:
at least one insulation layer comprising a first rigid region and a flexible region extending from the first rigid region;
at least one first circuit pattern disposed on a first surface of the at least one insulation layer to at least partially transverse the flexible region from the first rigid region; and
at least one conductive pad at least partially disposed on a surface of the at least one first circuit pattern in the first rigid region,
wherein a sum of thicknesses of the at least one conductive pad and the at least one first circuit pattern from the first surface of the at least one insulation layer in the first rigid region is 1.5 times to 4.0 times the thickness of the at least one first circuit pattern in the flexible region,
wherein the at least one conductive pad comprises a plating layer at least partially grown on the surface of the at least one first circuit pattern,
wherein the flexible region is configured to flexibly deform more than the first rigid region, wherein at least a portion of the at least one first circuit pattern comprises at least a portion of an electrically conductive film laminated on the first surface of the at least one insulation layer, and wherein the electrically conductive film includes a rolled copper foil and has higher durability regard to repeated deformation than a durability of the plating layer or an electrolytic copper foil.

2. The printed circuit board of claim 1, a side surface of the at least one conductive pad is formed to be at least partially inclined with respect to the first surface of the at least one insulation layer or the surface of the at least one first circuit pattern.

3. The printed circuit board of claim 1,
wherein the at least one insulation layer further comprises a second rigid region connected to the first rigid region through the flexible region, and
wherein the flexible region is configured to flexibly deform more than the second rigid region.

4. The printed circuit board of claim 3, wherein the at least one first circuit pattern further comprises another portion disposed in the second rigid region.

5. The printed circuit board of claim 1, further comprising:
at least one via conductor disposed to pass through the at least one insulation layer in the first rigid region,
wherein the at least one via conductor comprises at least a portion of a plating layer integrally formed with the at least one conductive pad.

6. The printed circuit board of claim 1, further comprising:
a second circuit pattern disposed on a second surface of the at least one insulation layer so as to extend from the first rigid region and to at least partially transverse the second surface of the flexible region; and
at least one via conductor disposed to pass through the at least one insulation layer in the first rigid region,
wherein the at least one via conductor is configured to electrically connect the second circuit pattern to the at least one first circuit pattern.

7. The printed circuit board of claim 6, further comprising:
at least one via hole disposed to pass through the at least one insulation layer,
wherein the at least one via conductor comprises a plating layer disposed on the at least one via hole while being in contact with the second circuit pattern, and
wherein the at least one conductive pad comprises a plating layer disposed in contact with the at least one first circuit pattern while being connected to the at least one via conductor.

8. The printed circuit board of claim 1,
wherein a plurality of insulation layers are sequentially stacked,
wherein the at least one first circuit patterns comprises a plurality of the first circuit patterns, and
wherein the plurality of the first circuit patterns are disposed between two adjacent insulation layers among the plurality of insulation layers or on at least a portion of the first surface of an outermost insulation layer among the plurality of insulation layers, respectively.

9. The printed circuit board of claim 8, comprising:
at least one via hole disposed to pass through at least one insulation layer of the plurality of insulation layers; and
a via conductor comprising a plating layer disposed on the at least one via hole,
wherein the via conductor is configured to electrically connect two adjacent first circuit patterns positioned on different layers among the plurality of the first circuit patterns.

10. The printed circuit board of claim 9, wherein the at least one conductive pad is a plating layer connected to the via conductor and is disposed in contact with one of the plurality of the first circuit patterns.

11. An electronic device comprising:
a first housing;
a second housing coupled to the first housing and coupled to be rotatable with respect to the first housing;
a hinge structure configured to rotatably couple the second housing to the first housing; and
a printed circuit board according to claim 1.

* * * * *